US010256096B2

(12) United States Patent
Huang et al.

(10) Patent No.: US 10,256,096 B2
(45) Date of Patent: Apr. 9, 2019

(54) SELF-ALIGNED DOUBLE PATTERNING

(71) Applicant: Taiwan Semiconductor Manufacturing Company, Ltd., Hsin-Chu (TW)

(72) Inventors: Kuan-Wei Huang, Taoyuan (TW); Chia-Ying Lee, New Taipei (TW); Ming-Chung Liang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 202 days.

(21) Appl. No.: 14/869,610

(22) Filed: Sep. 29, 2015

(65) Prior Publication Data
US 2016/0020100 A1 Jan. 21, 2016

Related U.S. Application Data

(63) Continuation of application No. 14/328,174, filed on Jul. 10, 2014, now Pat. No. 9,406,511.

(51) Int. Cl.
*H01L 21/44* (2006.01)
*H01L 21/033* (2006.01)
(Continued)

(52) U.S. Cl.
CPC ...... *H01L 21/0338* (2013.01); *H01L 21/0332* (2013.01); *H01L 21/0335* (2013.01);
(Continued)

(58) Field of Classification Search
CPC ............ H01L 21/027; H01L 21/0332; H01L 21/0334; H01L 21/0335; H01L 21/0337; H01L 21/0338; H01L 21/311; H01L 21/31105; H01L 21/31111; H01L 21/31116; H01L 21/31122;
(Continued)

(56) References Cited

U.S. PATENT DOCUMENTS 6,610,607 B1    8/2003  Armbrust et al.
7,666,578 B2 *  2/2010  Fischer ............... H01L 21/0338
                                                          430/312
(Continued)

FOREIGN PATENT DOCUMENTS

CN          103367119 A       10/2013

OTHER PUBLICATIONS

Bencher, C., et al., "22nm Half-Pitch Patterning by CVD Spacer Self Alignment Double Patterning (SADP)," Proc. SPIE 6924, Optical Microlithography XXI, 69244E, Mar. 7, 2008.
(Continued)

*Primary Examiner* — Kevin M Picardat
(74) *Attorney, Agent, or Firm* — Slater Matsil, LLP

(57) ABSTRACT

A semiconductor device and a method of forming the same are provided. An embodiment comprises a target layer and masking layers over the target layer. First openings are formed in the uppermost layer of the masking layers. Spacers are formed along sidewalls of the first openings, remaining first openings having a first pattern. Second openings are formed in the uppermost layer of the masking layers, the second openings having a second pattern. The first pattern and the second pattern are partially transferred to the target layer.

20 Claims, 12 Drawing Sheets

(51) Int. Cl.
*H01L 21/768* (2006.01)
*H01L 21/311* (2006.01)

(52) U.S. Cl.
CPC .... *H01L 21/0337* (2013.01); *H01L 21/31144* (2013.01); *H01L 21/76816* (2013.01); *H01L 21/76831* (2013.01); *H01L 21/76877* (2013.01)

(58) Field of Classification Search
CPC ......... H01L 21/31127; H01L 21/31133; H01L 21/31138; H01L 21/32135; H01L 21/76802; H01L 21/76816; H01L 21/76831; H01L 21/76877
USPC ....... 438/666, 671, 667, 669, 672, 700, 701, 438/702, 717
See application file for complete search history.

(56) References Cited

U.S. PATENT DOCUMENTS

| | | | |
|---|---|---|---|
| 7,871,909 B1 | 1/2011 | Wang et al. | |
| 8,669,180 B1 | 3/2014 | Lee et al. | |
| 8,932,961 B2 | 1/2015 | Mehta et al. | |
| 8,969,206 B1* | 3/2015 | Sel | H01L 21/0337 216/46 |
| 9,156,306 B2* | 10/2015 | Pain | B82Y 10/00 |
| 9,257,279 B2 | 2/2016 | Yang et al. | |
| 2006/0046201 A1* | 3/2006 | Sandhu | H01L 21/0337 430/314 |
| 2008/0299773 A1 | 12/2008 | Watanabe | |
| 2010/0035191 A1 | 2/2010 | Huang et al. | |
| 2010/0120247 A1* | 5/2010 | Park | H01L 21/0338 438/691 |
| 2011/0124134 A1 | 5/2011 | Lin et al. | |
| 2012/0085733 A1* | 4/2012 | Mebarki | H01L 21/0338 216/37 |
| 2014/0099792 A1* | 4/2014 | Bergendahl | H01L 21/3086 438/696 |
| 2015/0097263 A1* | 4/2015 | Kim | H01L 21/743 257/506 |
| 2015/0145070 A1* | 5/2015 | Song | H01L 21/28123 257/401 |
| 2015/0200095 A1 | 7/2015 | Huang et al. | |
| 2015/0200096 A1* | 7/2015 | Huang | H01L 21/0338 257/390 |

OTHER PUBLICATIONS

Finders, J., et al., "Double Patterning for 32 nm and Below: An Update," Proc. SPIE 6924, Optical Microlithography XXI, 6924, Mar. 18, 2008, pp. 692408-1-692408-12.

Zhang, H., et al., "Mask Cost Reduction with Circuit Performance Consideration for Self-Aligned Double Patterning," 16th Asia and South Pacific Design Automation Conference (ASP-DAC), Jan. 2011, pp. 787-792.

Zimmerman, P., "Double patterning lithography: double the trouble or double the fun?" SPIE Newsroom, 10.1117/2.1200906.1691, Jul. 20, 2009, 3 pages.

* cited by examiner

SELF-ALIGNED DOUBLE PATTERNING

PRIORITY CLAIM AND CROSS-REFERENCE

This application is a continuation of U.S. application Ser. No. 14/328,174 entitled, "Self-Aligned Double Patterning," filed Jul. 10, 2014, which is incorporated herein by reference.

BACKGROUND

Generally, active devices and passive devices are formed on and in a semiconductor substrate. Once formed, these active devices and passive devices may be connected to each other and to external devices using a series of conductive and insulative layers. These layers may help to interconnect the various active devices and passive devices as well as provide an electrical connection to external devices through, for example, a contact pad.

To form these interconnections within these layers, a series of photolithographic, etching, deposition, and planarization techniques may be employed. However, the use of such techniques has become more complicated as the size of active and passive devices have been reduced, causing a reduction in the size of the interconnects to be desired as well. As such, improvements in the formation and structure of the interconnects is desired in order to make the overall devices smaller, cheaper, and more efficient with fewer defects or problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
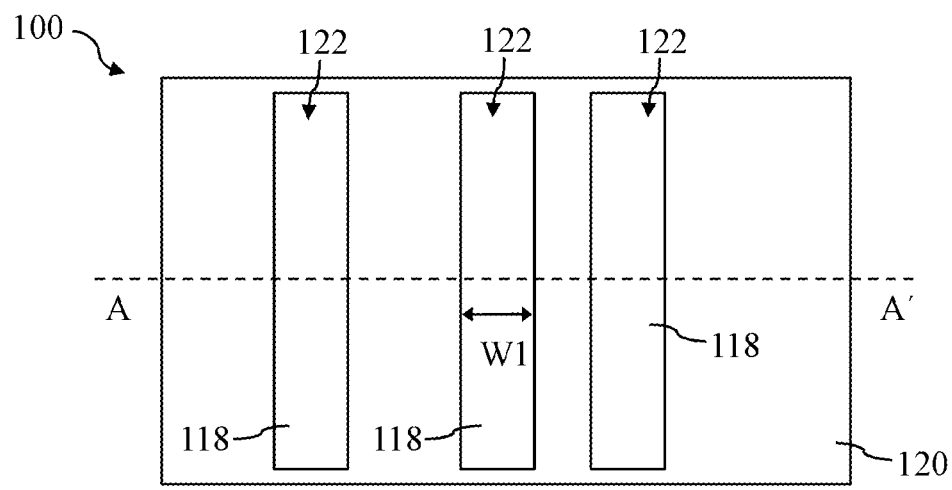
FIGS. 1A through 11B illustrate top and cross-sectional views of intermediate stages of a method of manufacturing a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, using double-patterning lithography processes to form interconnects in a dielectric layer. The double patterning techniques discussed herein, however, may be used to form other structures in other embodiments. For example, the embodiments discussed herein may be used to form conductive lines, redistribution lines, bit and/or word lines of a static random access memory (SRAM) cell.

FIGS. 1A-11B illustrate various intermediate stages of a method of forming a semiconductor device 100 in accordance with some embodiments. With reference to the figures, two views are presented for each step or steps discussed below, wherein the "B" figure is a cross-sectional view along the A-A' line in the corresponding A figure. For example, FIG. 1B is a cross-sectional view along the A-A' line in FIG. 1A. In addition, unless otherwise noted, various layers and their patterned counterparts will be referred with the same reference number.

Figure 1B:
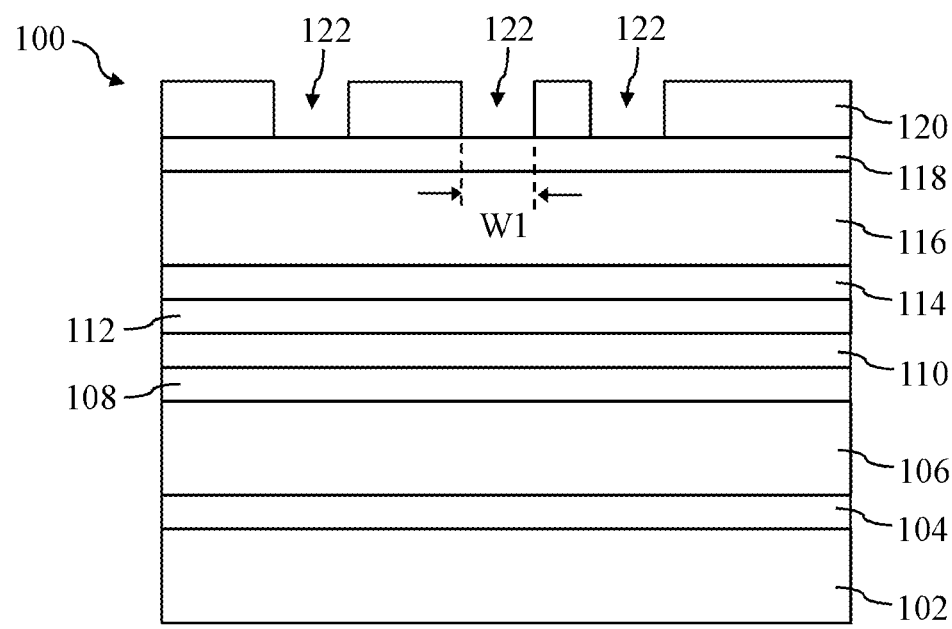

FIGS. 1A-2B illustrate a first lithography process and a first etching process in accordance with some embodiments. Referring first to FIGS. 1A and 1B, a portion of a substrate 102 having an overlying target layer 106 is shown. The substrate 102 may comprise, for example, bulk silicon, doped or undoped, or a layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. It should be noted that a portion of the substrate 102 is shown in FIG. 1B and that the substrate 102 may include various other components. For example, the substrate 102 may include a semiconductor substrate having electrical circuitry formed thereon. The substrate 102 may further include various layers, such as an inter-layer dielectric (ILD) layer, one or more inter-metal dielectric (IMD) layers, and one or more metallization layers. Generally, the dielectric layers and the associated metallization layers are used to interconnect the electrical circuitry to each other and to provide an external electrical connection. As an example, the target layer 106 is a dielectric layer, such as an ILD layer or an IMD layer, in which a metallization layer is to be formed.

As discussed in greater detail below, the target layer 106 will be patterned with openings, which openings may, for example, be filled with a suitable material according to design specifications of the semiconductor device 100. In some embodiments, the target layer 106 is a dielectric layer. The dielectric layer will be patterned with openings, which openings may, for example, be filled with a conductive material such as copper. In some embodiments, the dielectric layer is formed of a low-K dielectric material, such as phosphosilicate glass (PSG), borophosphosilicate glass (BPSG), fluorinated silicate glass (FSG), SiOxCy, Spin-On-Glass, Spin-On-Polymers, silicon carbon material, compounds thereof, composites thereof, combinations thereof, or the like, by any suitable method, such as spinning, chemical vapor deposition (CVD), and plasma-enhanced CVD (PECVD). It should also be noted that the dielectric layer may comprise a plurality of dielectric layers.

As shown in FIG. 1B, an etch stop layer (ESL) 104 may be interposed between the substrate 102 and the target layer 106. The ESL 104 may comprise a dielectric material, such as silicon nitride, silicon oxynitride, silicon oxycarbide, silicon carbide, combinations thereof, and multi-layers thereof, and may be formed using suitable deposition techniques such as sputtering, CVD, and the like. Generally, the ESL 104 is formed of a material exhibiting a low etch rate as compared to the overlying material. For example, in the embodiment illustrated in FIG. 1B, the target layer 106 is to be etched and the ESL 104 will act as an etch stop. In this situation, the material used to form the ESL 104 is selected such that the ESL 104 will have a lower etch rate than the material of the target layer 106. In this manner, the etch process essentially stops at the ESL 104 due to the low etch rate.

Referring further to FIG. 1B, a stack of hard mask layers is formed over the target layer 106. In the illustrated embodiment, the stack of hard mask layers comprises a first hard mask layer 108, a second hard mask layer 110 over the first hard mask layer 108, a third hard mask layer 112 over the second hard mask layer 110, and a fourth hard mask layer 114 over the third hard mask layer 112. The first hard mask layer 108, the second hard mask layer 110, the third hard mask layer 112, and the fourth hard mask layer 114 may be dielectric and/or metal hard mask layers, or may be formed of suitable materials, such as, for example, conductive, semiconductive, or dielectric materials.

A dielectric hard mask layer may be formed of silicon oxide, tetraethyl orthosilicate (TEOS), nitrogen-free anti-reflective coating (NFARC), silicon carbide, silicon oxynitride, or the like. The formation methods may include PECVD, high-density plasma (HDP) deposition, a spin-on process, the like, or a combination thereof.

A metal hard mask layer may comprise titanium, tantalum, titanium nitride, tantalum nitride, or the like. The formation methods may include suitable blanket deposition techniques, such as physical vapor deposition (PVD), radio frequency PVD (RFPVD), atomic layer deposition (ALD), the like, or a combination thereof.

In the illustrated embodiment, for example, the first hard mask layer 108 comprises NFARC. The first hard mask layer 108 comprising NFARC is used to prevent radiation in a subsequent photolithographic process to reflecting off layers below and interfering with the exposure process. Such interference can increase the critical dimension of the photolithography process. In addition, the second hard mask layer 110 comprises titanium nitride, and the third hard mask layer 112 comprises TEOS, as examples. The fourth hard mask layer 114 may be formed of amorphous silicon, silicon, or another material that has a high etching selectivity relative to the underlying third hard mask layer 112. As described below in greater detail, the stack of hard mask layers is used during intermediate steps of forming the semiconductors device 100, and the stack of hard mask layers may be consumed during the manufacturing process.

Over the fourth hard mask layer 114 resides a tri-layer comprising a first bottom layer 116, a first middle layer 118 over the first bottom layer 116, and a first top layer 120 over the first middle layer 118. In some embodiments, the first bottom layer 116 and the first top layer 120 are formed of photo resists, which may comprise, for example, organic materials. The first middle layer 118 may comprise an inorganic material, which may be a nitride (such as silicon nitride), an oxynitride (such as silicon oxynitride), an oxide (such as silicon oxide), or the like. The first middle layer 118 has a high etch selectivity relative to the first bottom layer 116 and the first top layer 120, and hence the first top layer 120 is used as an etch mask for patterning of the first middle layer 118, and the first middle layer 118 is used as an etch mask for patterning of the first bottom layer 116. In general, multi-layer photomasks are used to pattern features with sizes close to photolithography limits. Features of even smaller sizes may be patterned using a double-patterning method described below.

In some embodiments, the first top layer 120 is formed by patterning a photoresist material using photolithography techniques. Generally, the photoresist material is deposited, irradiated (exposed) and developed to remove a portion of the photoresist material. The remaining photoresist material protects the underlying material from subsequent processing steps, such as etching. In the illustrated embodiment, the top layer has first openings 122 that expose portions of a surface of the first middle layer 118, as illustrated in FIG. 1B. As discussed above, patterns that may be obtained using a single photolithography process are limited. As explained below, multiple photolithography and etch processes are utilized to pattern the second hard mask layer 110, which is subsequently used to pattern the underlying target layer 106. A particular pattern of the first openings 122, as illustrated in FIG. 1A, is for illustrative purposes only, and various different patterns may be formed in the first top layer 120 according to design specifications of the semiconductor device 100. In some embodiments, the first openings 122 have a first width W1 between about 25 nm and about 70 nm.

Figure 2A:
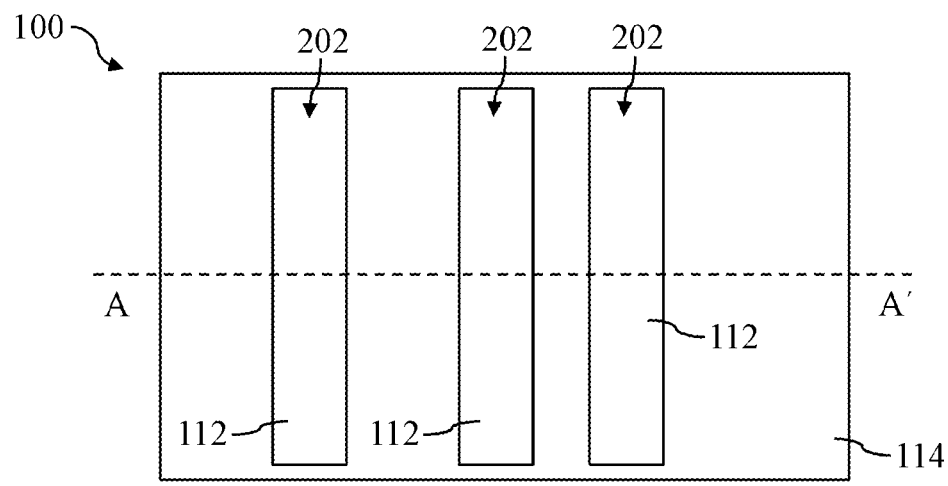
Figure 2B:
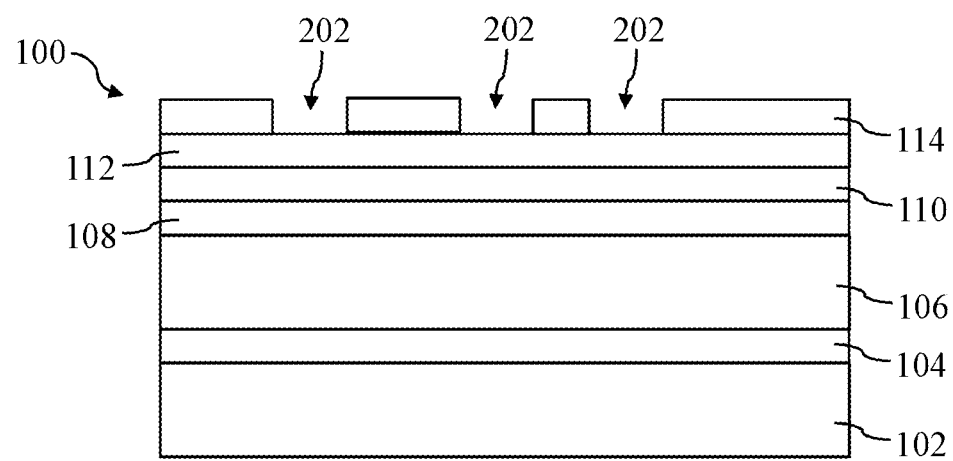

FIGS. 2A and 2B illustrate the resulting structure after the pattern of the first openings 122 of the first top layer 120 has been transferred to the fourth hard mask layer 114. In some embodiments, the first etch process is performed to transfer the pattern of the first openings 122 of the first top layer 120 to the fourth hard mask layer 114. In an embodiment in which the fourth hard mask layer 114 is formed of amorphous silicon, the pattern may be transferred to the fourth hard mask layer 114 using an anisotropic dry etch process using, for example, $CF_4$ plasma, $SF_6$ plasma, or the like. During the first etch process, the first top layer 120, the first middle layer 118, and the first bottom layer 116 may be consumed. If any residue of the first top layer 120, the first middle layer 118, and the first bottom layer 116 is left after the patterning, the residue may be also removed. The first etch process is anisotropic, such that second openings 202 in the fourth hard mask layer 114 have approximately the same sizes as their respective first openings 122 in the first top layer 120 (see FIG. 1B). Accordingly, in the illustrated embodiment, a pattern of the second openings 202 is the same as the pattern of the first openings 122.

Figure 3A:
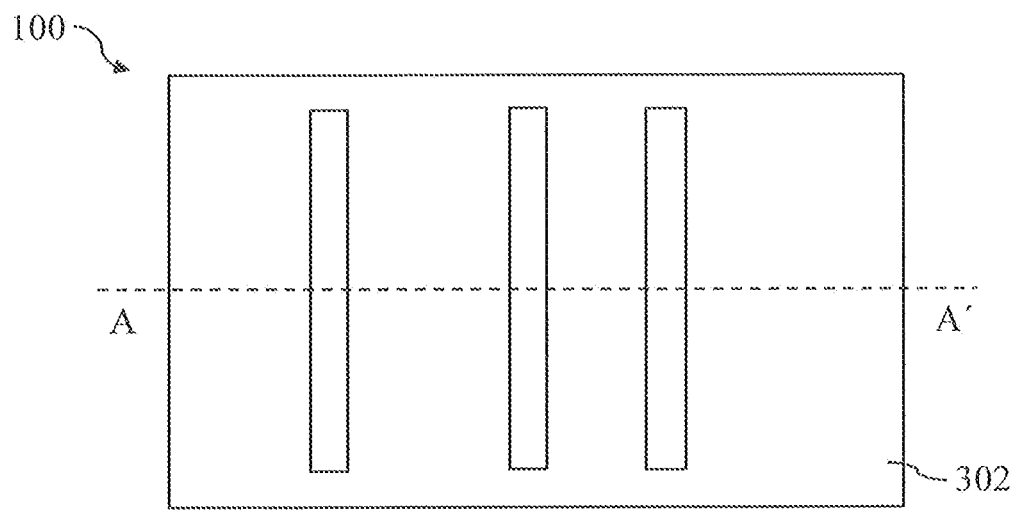
Figure 3B:
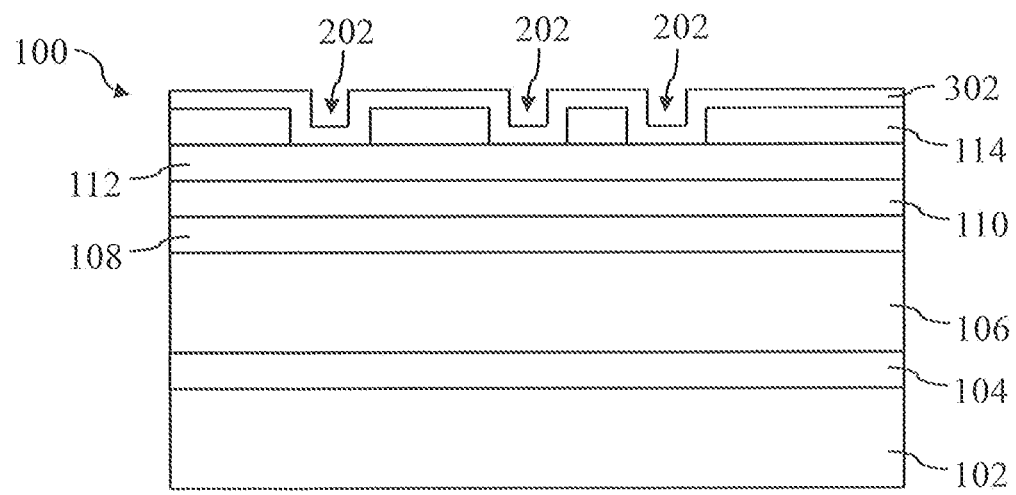

FIGS. 3A and 3B illustrate a spacer layer 302 formed over the patterned fourth hard mask layer 114 in accordance with some embodiments. As discussed in greater detail below, the spacer layer 302 is formed as a conformal layer over the patterned fourth hard mask layer 114 and over bottoms and sidewalls of the second openings 202. A subsequent etch process will be performed to remove portions of the spacer layer 302 from the topmost surface of the fourth hard mask layer 114 and the bottoms of the second openings 202, leaving spacers formed along the sidewalls of the second openings 202 of the patterned fourth hard mask layer 114.

The material of the spacer layer 302 is selected to have high etch selectivity relative to the fourth hard mask layer 114. For example, in an embodiment, the spacer layer 302 may be formed of AlO, MN, AlON, TaN, TiN, TiO, SiO, or SiN, although other materials such as nitrides, oxides, oxynitrides, carbides, borides, combinations thereof, or the like, could alternatively be used. The spacer layer 302 may be formed using, for example, low pressure CVD (LPCVD), PVD, ALD, the like, or the combination thereof. The spacer layer 302 may have a thickness of between about 10 nm and about 25 nm, such as about 18 nm. In an embodiment, the thickness of the spacer layer 302 is less than the technology node.

Figure 4A:
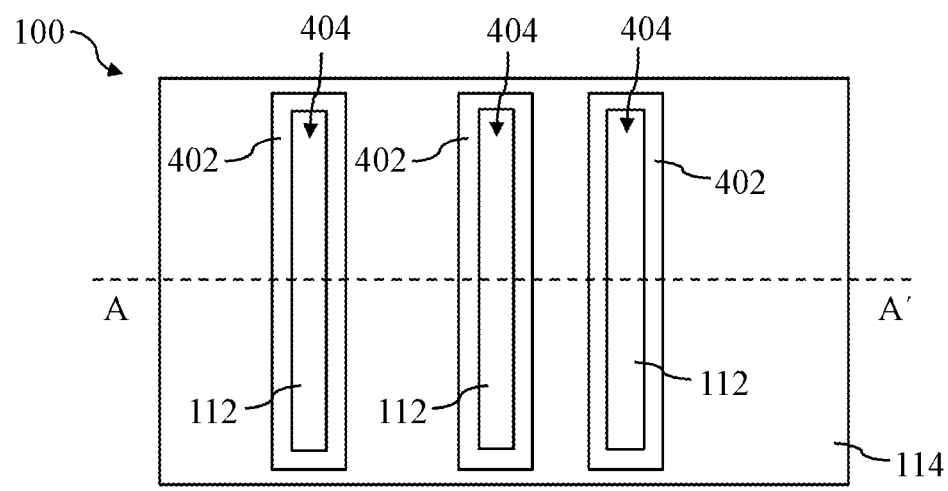
Figure 4B:
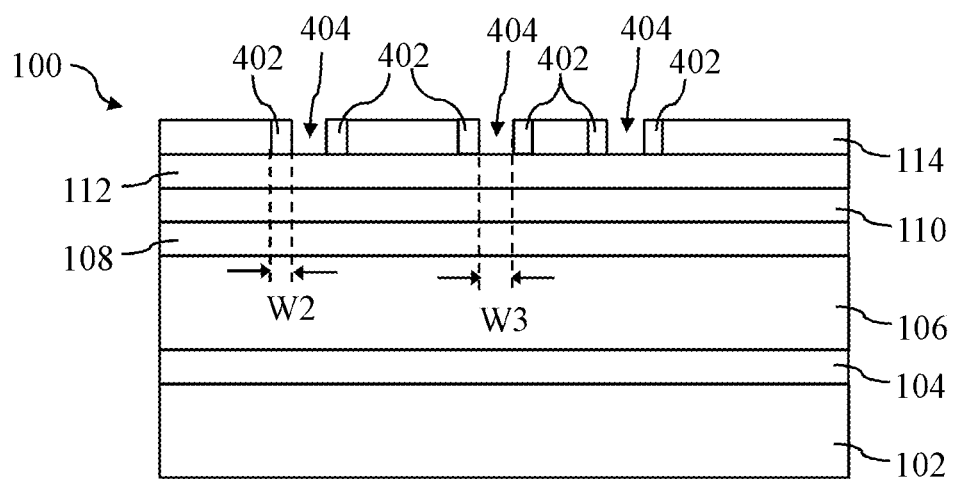

Referring next to FIGS. 4A and 4B, the spacer layer 302 is removed from the horizontal surfaces of the fourth hard mask layer 114 and the third hard mask layer 112, opening the patterned fourth hard mask layer 114. In an embodiment in which the spacer layer 302 is formed of TiO and the fourth hard mask layer 114 is formed of amorphous silicon, the spacer layer 302 may be etched using an anisotropic dry etch process. For example, the spacer layer 302 formed of TiO may be etched using an ion milling method, or the like. An anisotropic dry etch process such as this removes portions of the spacer layer 302 from the topmost surface of the fourth hard mask layer 114 and the bottoms of the second openings 202, leaving spacers 402 formed along the sidewalls of the second openings 202 of the patterned fourth hard mask layer 114, as illustrated in FIGS. 4A and 4B. The spacers 402 form a spacer mask over the third hard mask layer 112. In some embodiments, the spacers 402 have a second width W2 width between about 10 nm and about 25 nm.

In addition, this process forms third openings 404 in a combined layer comprising the patterned fourth hard mask layer 114 and the spacers 402. The patterns of the third openings 404 are also referred as line-A patterns. In the embodiment illustrated in FIGS. 4A and 4B, the line-A patterns are series of elongated openings in the planar surface. In other embodiments, however, other patterns may be utilized dependent upon the desired design and application of the semiconductor device 100. As described below in greater detail, the line-A patterns will be transferred to the target layer 106. In the illustrated embodiment, the third openings 404 have a third width W3 less than a width of the second openings 202. The third width W3 may be between about 10 nm and about 40 nm.

Figure 5A:
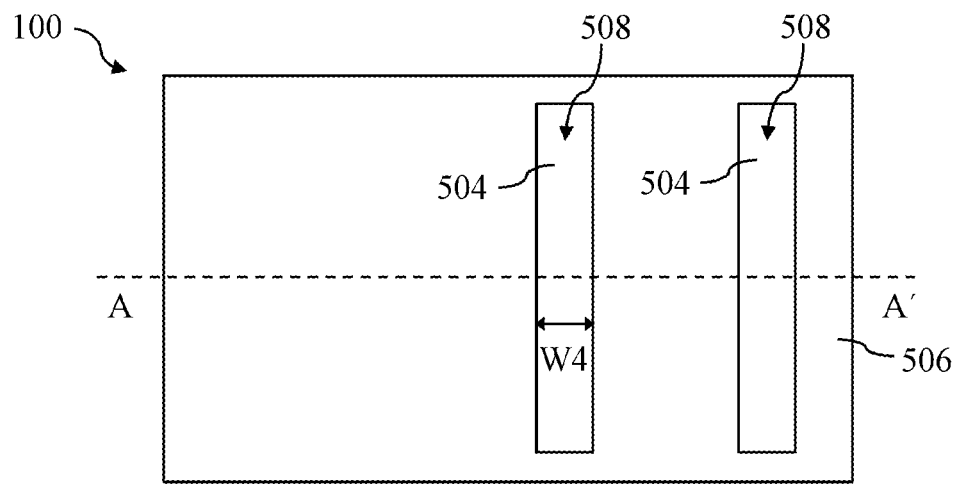

FIGS. 5A-6B illustrate a second photolithography and a second etch process performed on the fourth hard mask layer 114. Referring first to FIGS. 5A and 5B, a second bottom layer 502, a second middle layer 504, and a second top layer 506 are formed over the patterned fourth hard mask layer 114, the spacers 402, and the third hard mask layer 112. The materials of the second bottom layer 502, the second middle layer 504, and the second top layer 506 may be selected from the same candidate materials of the first bottom layer 116, the first middle layer 118, and the first top layer 120 of FIG. 1B, respectively. The second top layer 506 is patterned to form fourth openings 508 therein. In some embodiments, the second top layer 506 is patterned using a method similar to one used to pattern the first top layer 120 of FIG. 1B. Throughout the description, patterns of the fourth openings 508 are also referred to as line-B patterns. In some embodiments, the fourth openings 508 have a fourth width W4 between about 25 nm and about 70 nm.

Figure 5B:
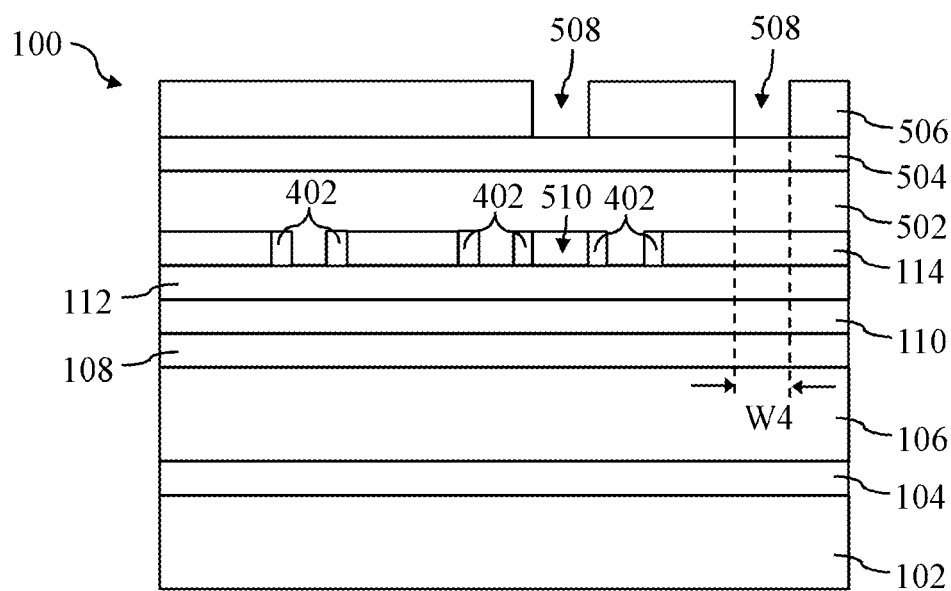

As described below in greater detail, the line-B patterns are transferred to the fourth hard mask layer 114, by removing portions of the fourth hard mask layer 114 that are unprotected by the second top layer 506. For example, a portion 510 of the fourth hard mask layer 114 will be removed since it is below one of the fourth openings, as illustrated in FIG. 5B.

Figure 6A:
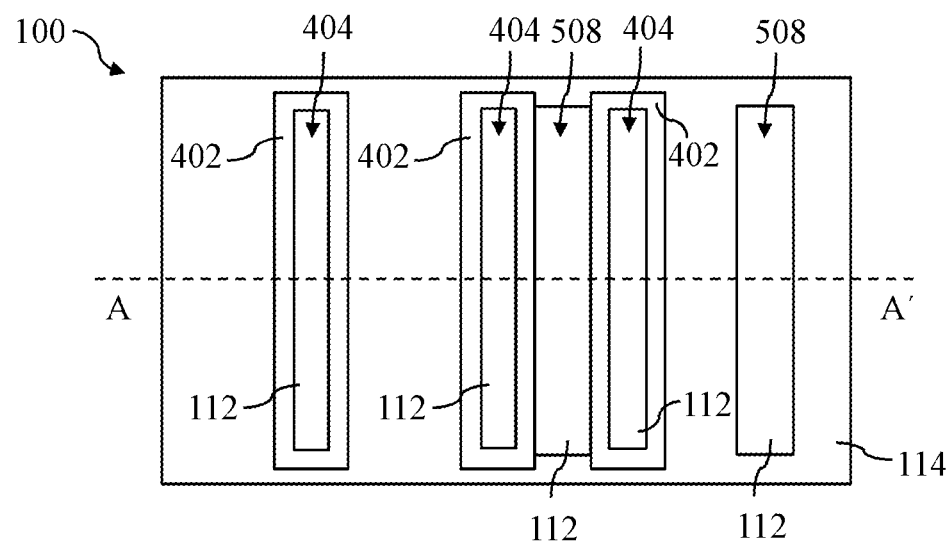
Figure 6B:
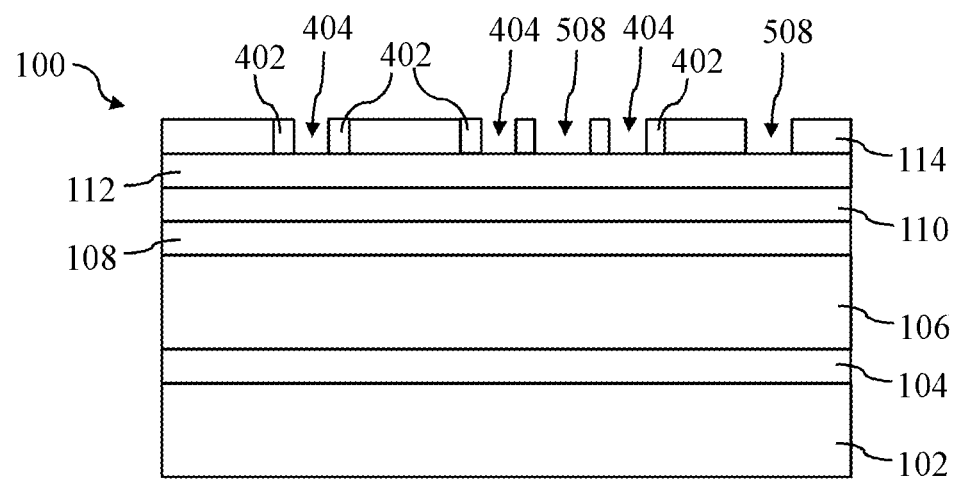

Referring to FIGS. 6A and 6B, the line-B patterns are transferred to the fourth hard mask layer 114 using, for example, an anisotropic dry etch process. In the illustrated embodiment, the sacrificial layer 114 has a high etch selectivity relative to the spacers 402 and the third hard mask layer 112, and portions of the fourth hard mask layer 114 are removed as illustrated in FIGS. 6A and 6B. As described below in greater detail, the line-A patterns and the line-B patterns will be transferred to the target layer 106.

Figure 7A:
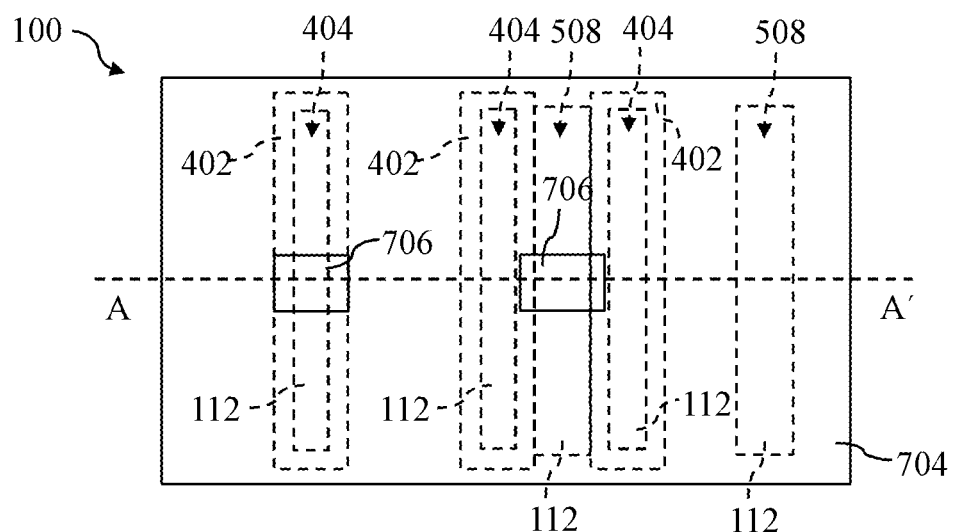
Figure 7B:
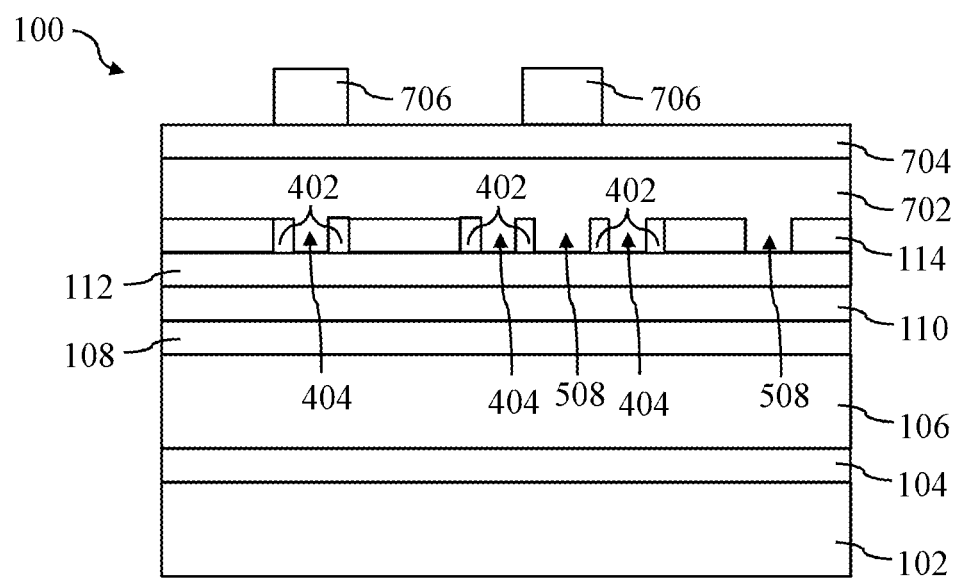
Figure 8A:
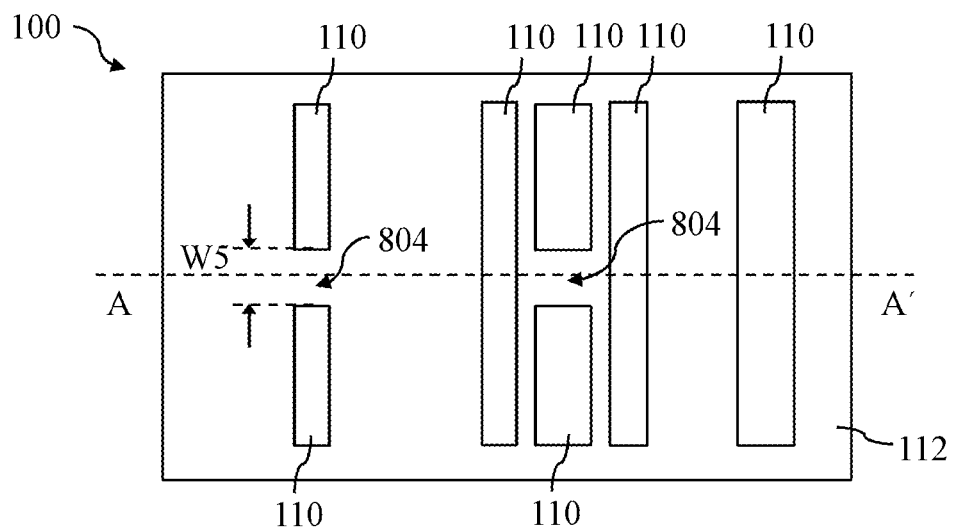
Figure 8B:
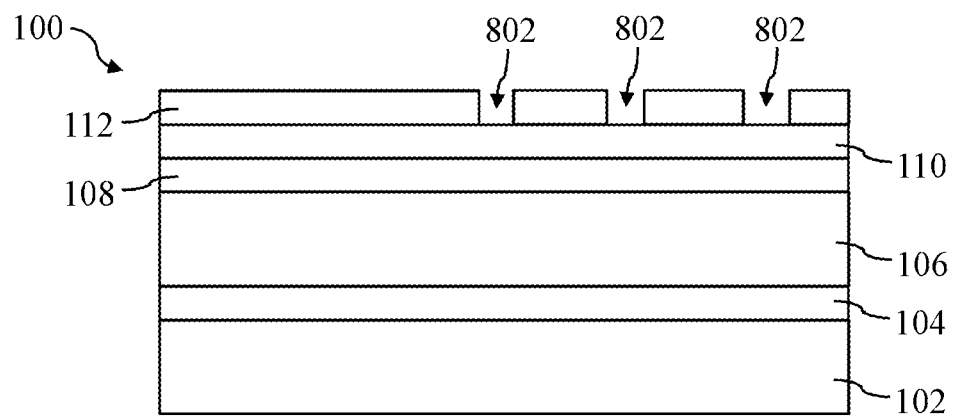

FIGS. 7A and 8B illustrate a cut photolithography and a cut etching process performed on the third hard mask layer 112. Referring to FIGS. 7A and 7B, a third bottom layer 702, a third middle layer 704, and a third top layer 706 are formed over the patterned fourth hard mask layer 114, the spacers 402, and the third hard mask layer 112. The materials of the third bottom layer 702, the third middle layer 704, and the third top layer 706 may be selected from the same candidate materials of the first bottom layer 116, the first middle layer 118, and the first top layer 120 of FIG. 1B, respectively. In some embodiments, the third top layer 706 is patterned using a method similar to one used to pattern the first top layer 120 of FIG. 1B. As described below in greater detail, the patterned third top layer 706, the spacers 402, and the patterned fourth hard mask layer 114 form an etch mask over the third hard mask layer 112. Subsequently, the etch mask is used to aid the cut etching process of the third hard mask layer 112.

As illustrated in FIGS. 7A and 7B, the third top layer 706 is utilized to cover a portion of one of the third openings 404 and a portion of the fourth openings 508. Accordingly, the third top layer 706 prevents transferring corresponding portions of the line-A patterns and the line-B patterns to the third hard mask layer 112. As described below in greater detail, during the cut etching process the portions of the line-A patterns and the line-B patterns protected by the third top layer 706 are not transferred to the third hard mask layer 112.

FIGS. 8A and 8B illustrate a pattern of the third hard mask layer 112 after the cut etch process in accordance with an embodiment. In the illustrated embodiment, unprotected portions of the third hard mask layer 112 are removed, for example, by an anisotropic dry etch process. As illustrated in FIG. 8A, the cut etch process forms fifth openings 802 in the third hard mask layer 112. Moreover, cuts or gaps 804 are formed in the line-A patterns and the line-B patterns that are transferred to the third hard mask layer 112. The cut etch forms a desired pattern in the third hard mask layer 112, and subsequently the desired pattern will be transferred to the target layer 106. In the illustrated embodiment, the desired pattern is a combination of the line-A patterns and the line-B patterns with the gaps 804 defined by the cut etch process. In an embodiment, the gaps 804 have a fifth width W5 between about 20 nm and about 70 nm, such as about 40 nm. In the illustrated embodiment, one of the line-A patterns and one of the line-B patterns are cut into two portions. In other embodiments, however, various number of the line-A patterns and the line-B patterns may be cut into two or more portions.

As described below in greater detail, the desired pattern in the third hard mask layer 112 is transferred to the target layer 106 and resulting trenches in the target layer 106 are filled by a suitable material. As described below in greater detail, the gaps 804 separate, for example, conductive lines formed in a dielectric layer. Accordingly, end-to-end distances between conductive lines are equal to the fifth width W5 of the gaps 804. In some embodiments, during the cut etch process, the fourth hard mask layer 114 and the spacers 402 may be fully consumed. In alternative embodiments, portions of the fourth hard mask layer 114 and the spacers 402 may remain on top of the patterned third hard mask layer 112.

Figure 9A:
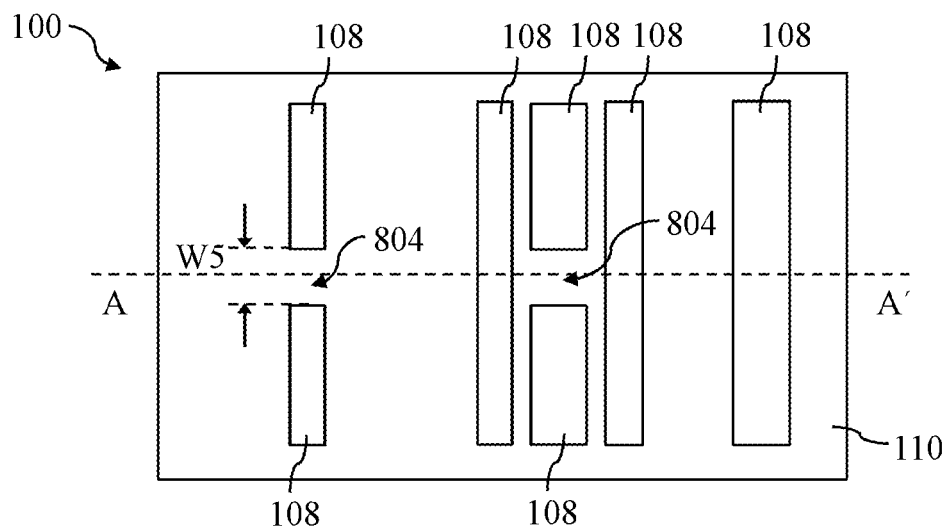
Figure 9B:
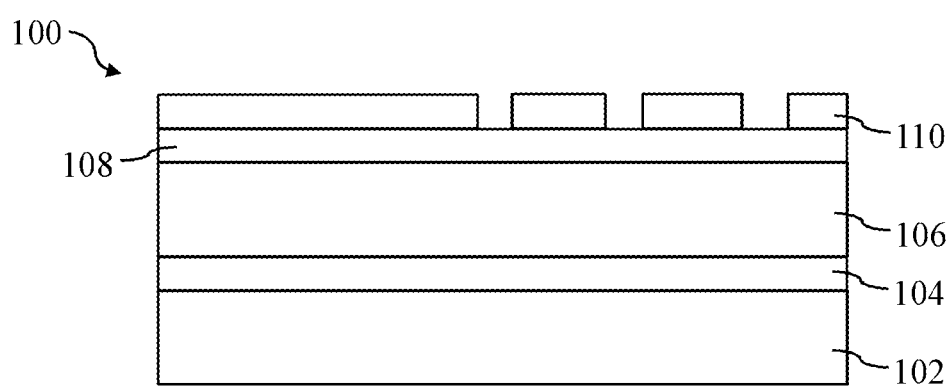

Subsequently, the third hard mask layer 112 is used as an etch mask to etch the second hard mask layer 110. The desired pattern is further transferred to the second hard mask layer 110 and the resulting structure is shown in FIGS. 9A and 9B. In some embodiments, the third hard mask layer 112 may be fully consumed during etching of the second hard mask layer 110.

Figure 10A:
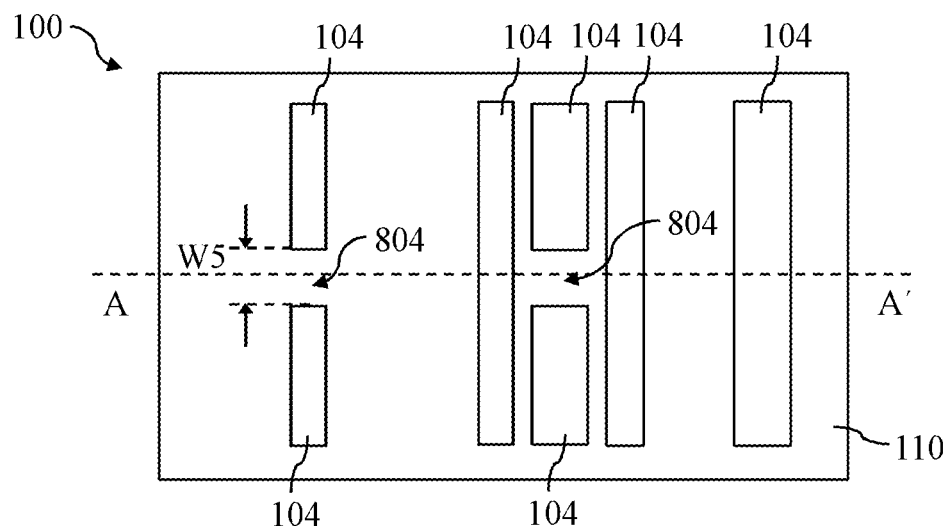
Figure 10B:
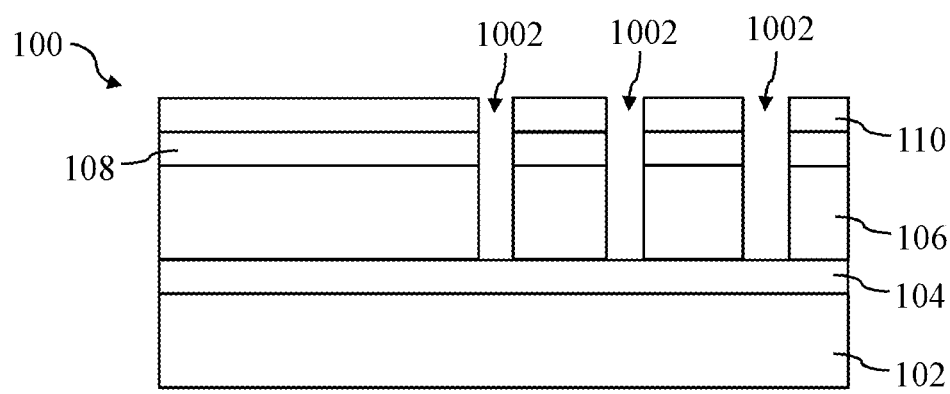

Referring to FIGS. 10A and 10B, the patterned second hard mask layer 110 is used as an etch mask to etch the underlying first hard mask layer 108 and the target layer 106. The desired pattern is transferred to the target layer 106 so that sixth openings 1002 are formed in the target layer 106.

Figure 11A:
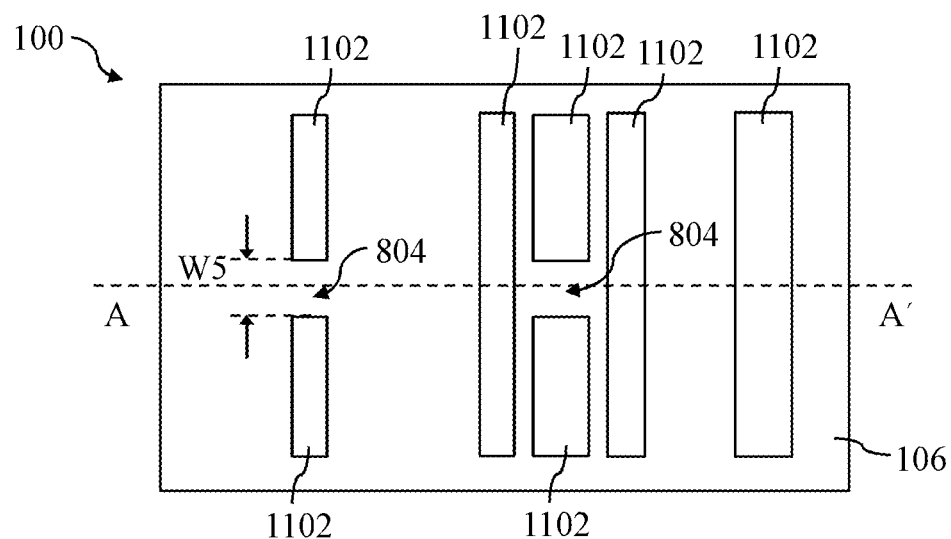
Figure 11B:
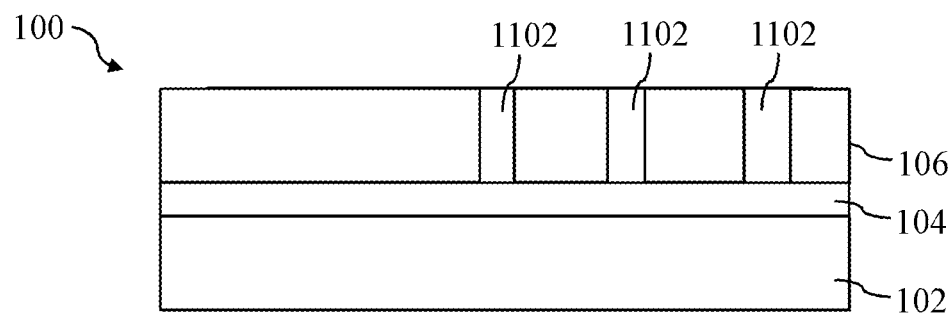

In an embodiment with the target layer 106 being a dielectric layer, FIGS. 11A and 11B illustrate a subsequent fill process to form conductive lines 1102. In some embodiments, the sixth openings 1002 are filled with copper, although other suitably conductive material may alternatively be utilized. The conductive lines 1102 may be formed using a damascene process, by which a portion of the dielectric layer is removed to form an opening, and the opening is filled and overfilled with the conductive material, such as copper. The overfilled conductive material with the patterned second hard mask layer 110 and the patterned first hard mask layer 108 may be removed using, for example, a planarization process (e.g., a chemical mechanical polishing (CMP)), an etch process, or other suitable processes.

The conductive lines 1102 may comprise copper, although other suitable materials such as aluminum, alloys, doped polysilicon, combinations thereof, and the like, may alternatively be utilized. Optionally, the openings may be lined with an adhesive and/or a barrier liner (not individually illustrated in FIGS. 11A and 11B) prior to filling with a conductive material. The liner may be, for example, an oxide formed from TEOS or silicon nitride, although any suitable dielectric material may alternatively be used. The liner may be formed using a PECVD process, although other suitable processes, such as PVD or a thermal process, may alternatively be used.

In some embodiments, the conductive lines 1102 may be part of a metallization layer of, for example, an SRAM device. The conductive lines 1102 may be used to electrically interconnect transistors that comprise an SRAM cell as well as to provide electrical connections to external circuitry. In other embodiments, the conductive lines 1102 may be bit lines and/or word lines of an SRAM cell.

Figure 12:
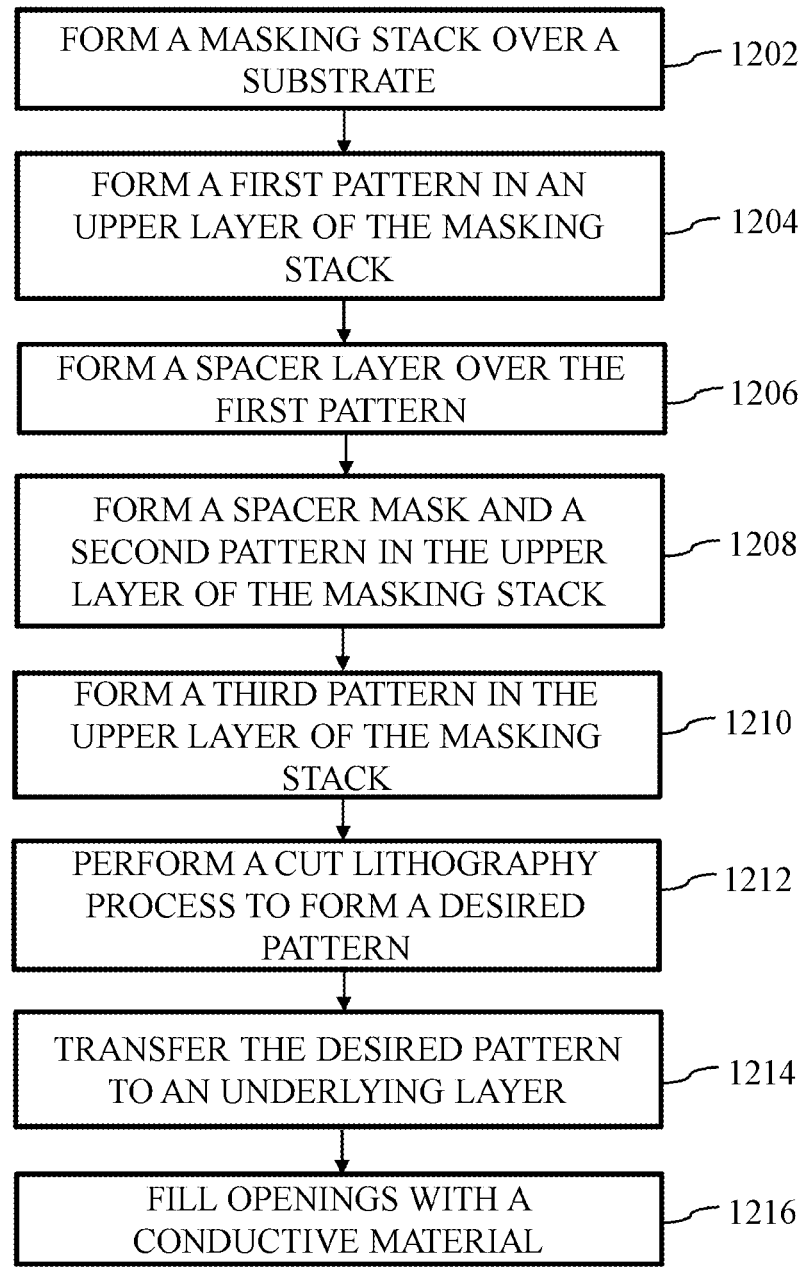
FIG. 12 is a flowchart illustrating a method of manufacturing a semiconductor device in accordance with some embodiments.

FIG. 12 is a flowchart illustrating a method that may be performed to manufacture a semiconductor device in accordance with an embodiment. The method begins at step 1202, wherein a masking stack is formed over a substrate. FIG. 1B illustrates an example in which a masking stack, including dielectric hard mask layers, metal hard mask layers, sacrificial layers and the like are formed over a dielectric layer, which is the layer in which patterns are desired to be formed. The masking stack will be subject to double patterning techniques as described above.

In step 1204, a first pattern is formed in an upper layer of the masking stack, such as that discussed above with reference to FIGS. 1A-2B, and in step 1206, a thin spacer layer is formed over the first pattern, such as that discussed above with reference to FIGS. 3A-3B. The thin spacer layer is etched to leave thin spacers along sidewalls of the first pattern, thereby creating a spacer mask, in step 1208, as discussed above with reference to FIGS. 4A and 4B. In addition, the spacer mask forming process forms a second pattern in an upper layer of the masking stack. In step 1210, a third pattern is formed in the upper layer of the masking stack, such as that discussed above with reference to FIGS. 5A-6B.

A cut lithography process is performed in step 1212 to cut some of the second and the third patterns in accordance with a desired pattern, such as that discussed above with reference to FIGS. 7A-8B. In step 1214, the desired pattern is transferred into an underlying layer, such as a dielectric layer as discussed above with reference to FIGS. 9A-10B, thereby leaving openings in the underlying layer. The openings are filled with a conductive material in step 1216, such as that discussed above with reference to FIGS. 11A and 11B.

Using a double patterning method with a cut last approach, as described above, allows manufacturers to reduce the size of the cuts or gaps in the formed patterns. This reduction of size in turn allows forming patterns and features with higher density. For example, the method described above may lead to smaller SRAM cell size and, therefore, to increased SRAM cell density in a SRAM device.

In an embodiment, a method of forming a semiconductor device, the method comprises forming a first mask and a second mask over an underlying layer, the second mask being interposed between the first mask and the underlying layer, forming first openings in the first mask, the first openings having a first pattern, the first openings exposing a first portion of the second mask, and forming second openings in the first mask, the second openings having a second pattern, the second openings exposing a second portion of the second mask. The method further comprises masking a portion of the first openings or a portion of the second openings to form a patterning mask for the second mask, patterning the second mask by using the patterning mask as a mask, thereby forming third openings in the second mask, the third openings having a third pattern, and transferring the third pattern to the underlying layer, thereby forming fourth openings in the underlying layer.

In another embodiment, a method of forming a semiconductor device, the method comprises depositing a first layer over a second layer, performing a first patterning of the first layer, thereby forming a first patterned layer, the first patterned layer having first openings, and forming spacers along sidewalls of the first openings, thereby forming narrowed first openings. The method further comprises performing a second patterning of the first patterned layer, thereby forming second openings in the first patterned layer, forming a cut mask over the first patterned layer, at least a portion of the cut mask being in the narrowed first openings or the second openings, and patterning the second layer using the cut mask and the first layer as a mask.

In yet another embodiment, a method of forming a semiconductor device, the method comprises depositing a second mask layer over a target layer, depositing a first mask layer over the second mask layer, forming a first opening in the first mask layer, the first opening having a first line pattern, and forming a second opening in the first mask layer, the second opening having a second line pattern. The method further comprises forming a third mask layer over the first mask layer, the third mask layer protecting a portion of the first opening or a portion of the second opening, thereby forming a gap in the first line pattern or the second line pattern, patterning the second mask layer using a combined mask, the combined mask comprising the third mask layer and the first mask layer, thereby forming a target mask, and patterning the target layer using the target mask as a mask.

In accordance with an embodiment, a method includes forming a first mask layer and a second mask layer over an underlying layer, the second mask layer being interposed between the first mask layer and the underlying layer. A first opening is formed in the first mask layer. A second opening is formed in the first mask layer, the second opening being different from the first opening. A portion of the first opening is masked to form a patterning mask for the second mask layer. The second mask layer is patterned using the patterning mask as a mask, thereby forming third openings in the second mask layer. The third openings are transferred to the underlying layer.

In accordance with another embodiment, a method includes depositing a first layer over a second layer. A first patterning of the first layer is performed, thereby forming a first patterned layer, the first patterned layer having a first opening. Spacers are formed along sidewalls of the first opening, thereby forming a narrowed first opening. A second patterning of the first patterned layer is performed, thereby forming a second opening in the first patterned layer. A cut mask is formed over the first patterned layer, at least a portion of the cut mask being in the narrowed first opening. The second layer is patterned using the cut mask and the first patterned layer as a combined mask to form a patterned second layer.

In accordance with yet another embodiment, a method includes depositing a first mask layer over a target layer. A first opening and a second opening are formed in the first mask layer. A second mask layer is formed over the first mask layer, the second mask layer protecting a portion of the first opening and a portion of the second opening. An unprotected portion of the first opening and an unprotected portion of the second opening are transferred to the target layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first mask layer and a second mask layer over an underlying layer, the second mask layer being interposed between the first mask layer and the underlying layer;
    forming a first opening in the first mask layer;
    forming spacers along sidewalls of the first opening;
    after forming the spacers, forming a second opening in the first mask layer, the second opening being different from the first opening, the second opening exposing a sidewall of a first spacer of the spacers and a sidewall of a second spacer of the spacers, a sidewall of the second opening extending from the sidewall of the first spacer to the sidewall of the second spacer;
    masking a portion of the second opening using a third mask layer to form a patterning mask for the second mask layer, the patterning mask comprising the spacers, the first mask layer and the third mask layer;
    patterning the second mask layer using the patterning mask as a mask, thereby forming third openings in the second mask layer; and
    transferring the third openings to the underlying layer.

2. The method of claim 1, wherein transferring the third openings to the underlying layer comprises patterning the underlying layer using the second mask layer as a mask.

3. The method of claim 1, wherein the first opening has a first rectangular shape and the second opening has a second rectangular shape as viewed from top, a long side of the first rectangular shape being parallel to a long side of the second rectangular shape.

4. The method of claim 3, wherein masking the portion of the second opening cuts the second rectangular shape into two disconnected rectangular shapes.

5. The method of claim 2, transferring the third openings to the underlying layer comprises forming fourth openings in the underlying layer.

6. The method of claim 5, further comprising filling the fourth openings with a conductive material.

7. A method comprising:
    depositing a first layer over a second layer;
    performing a first patterning of the first layer, thereby forming a first patterned layer, the first patterned layer having a first opening;
    forming spacers along sidewalls of the first opening, thereby forming a narrowed first opening;
    after forming the spacers, performing a second patterning of the first patterned layer, thereby forming a second opening in the first patterned layer, a sidewall of the narrowed first opening and a first sidewall of the second opening exposing a same spacer of the spacers, a second sidewall of the second opening exposing a portion of the first patterned layer, the second sidewall of the second opening being in physical contact with a pair of the spacers;
    forming a cut mask over the first patterned layer, at least a portion of the cut mask being in the second opening; and
    patterning the second layer using the cut mask and the first patterned layer as a combined mask to form a patterned second layer.

8. The method of claim 7, further comprising patterning a target layer using the patterned second layer as a mask.

9. The method of claim 7, wherein forming spacers comprises:
    conformally depositing a spacer layer over the first opening; and
    anisotropically etching the spacer layer.

10. The method of claim 7, wherein the narrowed first opening has a first polygonal shape and the second opening has a second polygonal shape as viewed from top, a long side of the first polygonal shape being parallel to a short side of the second polygonal shape.

11. The method of claim 10, wherein the first polygonal shape and the second polygonal shape are rectangular shapes.

12. The method of claim 7, wherein patterning the second layer comprises transferring unprotected portions of the second opening to the second layer to form a third opening and a fourth opening in the second layer.

13. The method of claim 12, wherein the third opening and the fourth opening are separated by a gap.

14. The method of claim 13, wherein the gap has a width between about 20 nm and about 70 nm.

15. The method of claim 7, wherein the spacers have a width between about 10 nm and about 25 nm.

16. A method comprising:
depositing a first mask layer over a target layer;
forming a first opening and a second opening in the first mask layer;
forming a first spacer element along a sidewall of the first opening;
forming a second spacer element along a sidewall of the second opening;
after forming the first spacer element and the second spacer element, forming a third opening in the first mask layer, a sidewall of the first spacer element being a first sidewall of the third opening, a sidewall of the second spacer element being a second sidewall of the third opening, a third sidewall of the third opening extending from the sidewall of the first spacer element to the sidewall of the second spacer element;
forming a second mask layer over the first mask layer, the second mask layer protecting a portion of the third opening; and
transferring the first opening, the second opening and an unprotected portion of the third opening to the target layer, wherein transferring the first opening, the second opening and the unprotected portion of the third opening to the target layer comprises patterning the target layer using the first spacer element, the second spacer element, the first mask layer and the second mask layer as a combined mask.

17. The method of claim 16, wherein the first spacer element has a width between about 10 nm and about 25 nm.

18. The method of claim 16, wherein the first opening and the second opening are formed using a first etching process and the third opening is formed using a second etching process, the first etching process being different from the second etching process.

19. The method of claim 18, wherein forming the first spacer element and the second spacer element comprises:
after performing the first etching process, depositing a spacer layer over the first mask layer; and
partially removing the spacer layer, remaining portions of the spacer layer forming a plurality of spacer elements.

20. The method of claim 19, wherein the second etching process removes a portion of the first mask layer between the first spacer element and the second spacer element.

\* \* \* \* \*